(12) United States Patent
Younis (10) Patent No.: US 7,092,480 B1
(45) Date of Patent: Aug. 15, 2006

(54) HIGH-SPEED SYNCHRONOUS COUNTERS WITH REDUCED LOGIC COMPLEXITY

(75) Inventor: Ahmed Younis, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/977,304

(22) Filed: Oct. 29, 2004

Related U.S. Application Data (62) Division of application No. 10/268,481, filed on Oct. 10, 2002, now Pat. No. 6,826,249.

(51) Int. Cl.
*H03K 23/54* (2006.01)
*H03H 11/26* (2006.01)

(52) U.S. Cl. .................. 377/122; 327/276; 327/279

(58) Field of Classification Search .............. 327/149, 327/152, 153, 159, 161, 276, 279, 286; 377/122–126
See application file for complete search history.

(56) References Cited

U.S. PATENT DOCUMENTS

| | | | | |
|---|---|---|---|---|
| 4,021,646 A | * | 5/1977 | Meier | 377/45 |
| 4,611,337 A | * | 9/1986 | Evans | 377/123 |
| 4,795,985 A | * | 1/1989 | Gailbreath, Jr. | 327/158 |
| 4,799,022 A | * | 1/1989 | Skierszkan | 327/116 |
| 4,856,035 A | * | 8/1989 | Lewis | 377/116 |
| 5,097,491 A | * | 3/1992 | Hall | 377/34 |
| 5,128,554 A | * | 7/1992 | Hoshizaki | 327/147 |
| 5,428,654 A | * | 6/1995 | Baqai | 377/34 |
| 5,604,775 A | * | 2/1997 | Saitoh et al. | 375/376 |
| 5,768,177 A | * | 6/1998 | Sakuragi | 365/194 |
| 5,778,214 A | * | 7/1998 | Taya et al. | 713/400 |
| 5,875,219 A | * | 2/1999 | Kim | 375/376 |
| 6,018,560 A | * | 1/2000 | Kim | 377/123 |
| 6,034,558 A | * | 3/2000 | Vanderschoot et al. | 327/277 |
| 6,292,040 B1 | * | 9/2001 | Iwamoto et al. | 327/158 |
| 6,294,938 B1 | * | 9/2001 | Coddington et al. | 327/158 |
| 6,333,655 B1 | * | 12/2001 | Ishizuka | 327/175 |
| 6,396,312 B1 | | 5/2002 | Shepston et al. | 327/105 |
| 6,556,643 B1 | * | 4/2003 | Merritt | 377/16 |
| 6,574,154 B1 | * | 6/2003 | Sato et al. | 365/198 |
| 6,917,228 B1 | * | 7/2005 | Cooper | 327/158 |
| 2002/0010897 A1 | * | 1/2002 | Stark | 716/1 |

OTHER PUBLICATIONS

M. Rafiquzzaman; "Fundamentals of Digital Logic and Microcomputer Design"; Copyright 1999 by Rafi Systems, Inc.; pp. 210-215.

(Continued)

*Primary Examiner*—Tuan T. Lam
(74) *Attorney, Agent, or Firm*—Arthur Joseph Behiel; LeRoy D. Maunu; John J. King (57) ABSTRACT

Described are fast synchronous counters with reduced combinatorial logic. In one embodiment, a four-bit shift register is configured in a ring and preset with a data pattern (e.g., 1000). The register is then rapidly shifted into any of four unique states. Combinatorial logic connected to the shift register converts the four unique states into a two-bit binary signal representative of the four states. In the general case, counters in accordance with this embodiment represent N-bit binary numbers using 2N synchronous storage elements. Two or more counters can be combined to produce larger synchronous counters. An up/down counter in accordance with yet another embodiment is connected to a multi-path delay line to create a variable delay circuit. The switching speed of the delay circuit is independent of the number of delay settings. Also advantageous, the delay circuit scales linearly, in terms of power consumption and area, with changes in delay granularity.

15 Claims, 6 Drawing Sheets

OTHER PUBLICATIONS

Barry Wilkinson; "The Essence of Digital Design" Prentice Hall Europe 1998; pp. 120-130.

http:/www.eelab.usyd.edu.au/digital_tutorial/part2/register07.html; "Shift Register Counters"; 2 pages.

* cited by examiner

HIGH-SPEED SYNCHRONOUS COUNTERS WITH REDUCED LOGIC COMPLEXITY

This application is a divisional application of U.S. application Ser. No. 10/268,481, filed Oct. 10, 2002, now U.S. Pat. No. 6,826,249.

BACKGROUND

Figure 1:
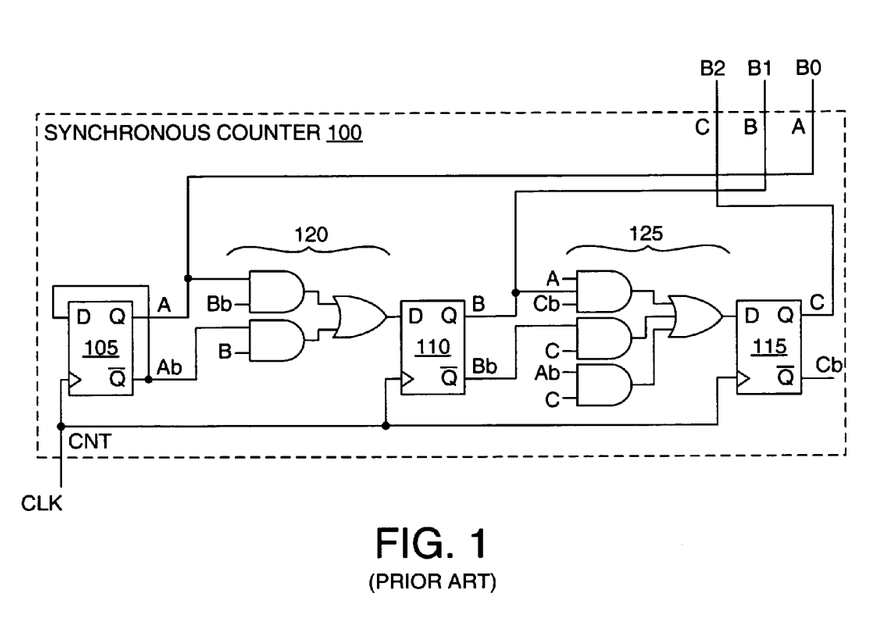
FIG. 1 (prior art) depicts a conventional three-bit synchronous counter 100 that counts from zero to seven.

Counters are common sequential logic circuits that create specific reoccurring output sequences, typically rising or falling binary numbers. FIG. 1 (prior art) depicts a conventional three-bit synchronous counter 100 that counts from zero (binary 000) to seven (binary 111). Counter 100 includes a count terminal CNT and three output terminals A, B, and C. Counter 100 increments upon receipt of each rising edge of a clock signal CLK on count terminal CNT. Counter 100 produces a three-bit binary signal B2–B0, where B0 represents the least-significant bit (LSB) and B2 represents the most-significant bit (MSB). Because counter 100 is synchronous, the updated output signals on terminals A, B, and C are available substantially simultaneously after counter 100 increments.

Synchronous counter 100 includes three sequential storage elements, flip-flops 105, 110, and 115. The synchronous "D" input terminal of flip-flop 105 connects to its own output terminal; the subsequent state for flip-flop 105 therefore depends upon its current state. The subsequent state of flip-flop 110 depends on its current state and the state of flip-flop 105. The logic required to provide the second bit therefore includes some combinatorial logic 120 that produces an input to flip-flop 110 based upon the contents of flip-flops 105 and 110. Finally, the subsequent state of the MSB stored in flip-flop 115 depends upon its own state and the states of the two lower order flip-flops 105 and 110. The D input of flip-flop 115 consequently includes more complex combinatorial logic 125 that derives the input of flip-flop 115 from the contents of all three flip-flops 105, 110, and 115.

Each time a bit is added to a synchronous counter of the type shown in FIG. 1, the combinatorial logic required to derive the input signal for the most significant bit grows more complex. This increase in complexity requires valuable real estate and reduces counting speed. Using faster circuits for the combinatorial logic can offset this speed reduction, but faster circuits consume more power, and are therefore undesirable. It can therefore be very difficult to produce high-speed synchronous counters with the significant number of bits.

Figure 2:
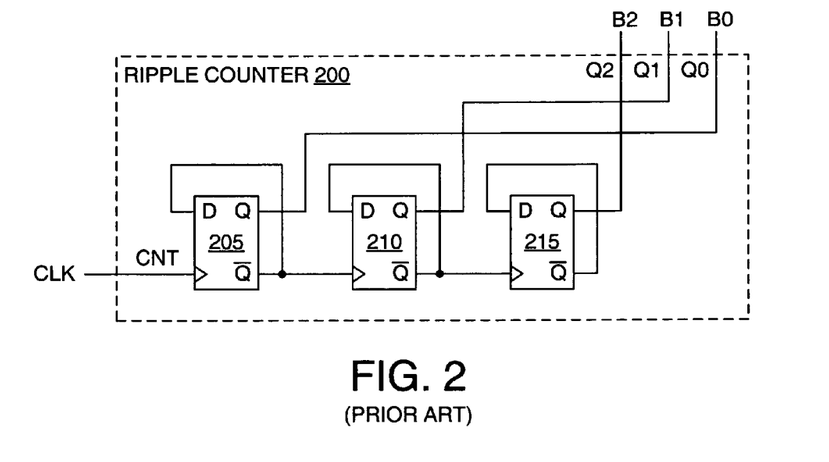
FIG. 2 (prior art) depicts a conventional three-bit ripple counter 200.

FIG. 2 (prior art) depicts a conventional three-bit ripple counter 200, which includes three flip-flops 205, 210, and 215. Ripple counters, in general, are capable of counting much faster than synchronous counters. This performance advantage is due to the fact that the input of each of flip-flop depends only on that flip-flops current state, so there is no need for the relatively complex combinatorial logic associated with synchronous counters. Unfortunately, the outputs provided by ripple counter 200 are not synchronous; that is, when counter 200 moves from one count to the next, the new value for the least significant bit (output Q0) is available before the new value for the next-most significant bit (output Q1), which is available before the new value for the most significant bit (output Q2). Ripple counter 200 thus changes from one value to the next (updates) relatively slowly. The time required for a counter to change from one value to the next is the counter's "latency." The maximum counting frequency of ripple counters remains relatively constant as the number of bits increases, but the latency rises linearly.

Returning to FIG. 1, the update speed of synchronous counter 100 is determined by the clock-to-out delay of flip-flop 115 and the delay through combinatorial logic circuit 125, which is presumed to be the slowest path in counter 100. For a small counter, such as the one shown, the combinatorial logic does not impose a significant delay; however, the complexity of the requisite combinatorial logic increases exponentially with the number of bits. Consequently, both the counting frequency and the latency are adversely affected by increases in the number of bits.

The latency of ripple counters renders them unsuitable for many applications. Synchronous counters are better, but the exponential growth in the required combinatory logic makes it difficult or impossible to strike an optimal balance between power, speed, and the number of bits for applications that require relatively large and fast synchronous counters. There is therefore a need for improved synchronous counters.

SUMMARY

The present invention addresses the need for improved synchronous counters. In one embodiment, a four-bit shift register is configured in a ring and preset with a data pattern (e.g., 1000). The register can then be rapidly shifted into any of four unique states. Combinatorial logic connected to the shift register converts the four unique states into a two-bit binary signal representative of the four states. In the general case, counters in accordance with this embodiment represent N-bit binary numbers using $2^N$ synchronous storage elements. Two or more of the foregoing counters can be chained together in series to produce larger synchronous counters. When thus combined, the number of synchronous storage elements grows linearly with the number of bits.

The most significant bits of conventional synchronous counters are the most logic intensive, and consequently have the biggest adverse impact on power consumption, area, and speed performance. One embodiment combines a ripple counter and a synchronous counter to reduce this impact. A ripple counter is used for one or more lower-order bits and a synchronous counter for the higher-order bits. The number of bits in the synchronous counter, and thus the combinatorial-logic overhead, is reduced by the number of bits in the ripple counter.

An up/down counter in accordance with yet another embodiment is connected to a multi-path delay line to create a variable delay circuit. The switching speed of the delay circuit is independent of the number of delay settings. Also advantageous, the delay circuit scales linearly, in terms of power consumption and area, with changes in delay granularity.

This summary does not limit the invention, which is instead defined by the allowed claims.

DETAILED DESCRIPTION

Figure 3:
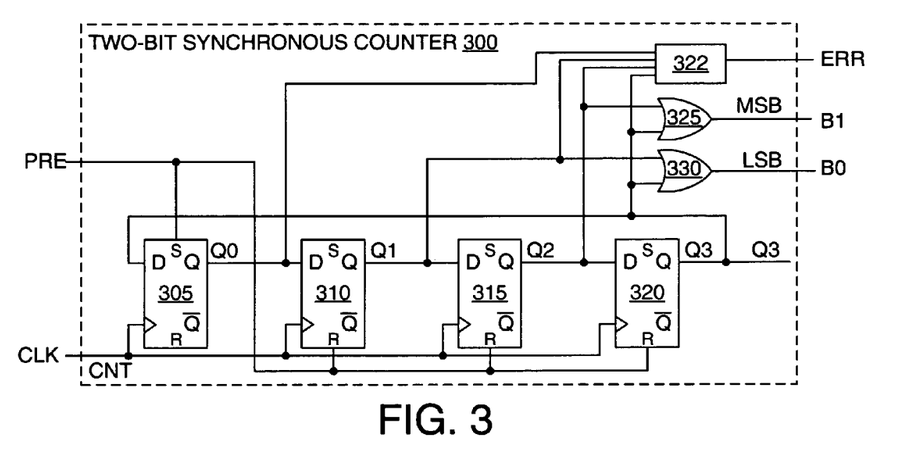
FIG. 3 depicts a two-bit synchronous counter 300 in accordance with one embodiment of the invention.

FIG. 3 depicts a two-bit synchronous counter 300 in accordance with one embodiment of the invention. Counter 300 is a ring counter with four synchronous storage elements, D flip-flops 305, 310, 315, and 320. The D input terminal of each flip-flop connects to the synchronous output terminal of the proceeding flip-flop in the ring, and the clock terminal of each flip-flop is connected to a common count line CNT. Flip-flops 305, 310, 315, and 320 are thus connected as a shift register with the rightmost output terminal connected to the leftmost input terminal. Finally, the set terminal of flip-flop 305 and the reset terminals of flip-flops 310, 315, and 320 all connect to a preset terminal PRE.

Asserting a preset signal on line PRE presets flip-flop 305 to a logic one and the remaining flip-flops 310, 315, and 320 to logic zeroes. The initial state of counter 300 is therefore 1000, which represents a logic zero in this example. Clocking counter 300 (i.e., issuing a count signal on line CNT) in this state moves the contents of each flip-flop to the subsequent flip-flop in the ring. This second state 0100 represents a logic one. Each subsequent clock cycle again moves the contents of each flip-flop to the subsequent flip-flop so that the logic one originally stored in flip-flop 305 eventually returns to flip-flop 305. The collection of flip-flops thus acts as a "bucket brigade" that cycles a logic one through four unique allowed states (1000, 0100, 0010, and 0001). Error-detection logic 322 issues an error flag ERR if counter 300 contains any state other than the four allowed states. Logic 322 can also be adapted to reset counter 300 in the event of an error.

Some encoding logic, a pair of OR gates 325 and 330 in this embodiment, logically combines the outputs of flip-flops 310, 315, and 320 to translate the four unique states of counter 300 into conventional binary numbers, as summarized in the following Table 1.

TABLE 1

| Counter State | Binary Number (B1, B0) | Decimal Equivalent |
|---|---|---|
| 1000 | 00 | 0 |
| 0100 | 01 | 1 |
| 0010 | 10 | 2 |
| 0001 | 11 | 3 |

Other embodiments cycle through other patterns of states (e.g., 0111, 1011, 1101, and 1110 or 1100, 0110, 0011, and 1001), and consequently employ different combinatorial logic. Embodiments that provide alternate binary sequences, such as Grey code, also employ different combinatorial logic. Further, while counter 300 generates two outputs using four flip-flops, counters of this type can be expanded to generate N outputs using $2^N$ flip-flops and the appropriate combinatorial logic in place of OR gates 325 and 330.

Counter 300 is a relatively fast synchronous counter. OR gates 325 and 330 are simple combinatory logic circuits that can be made to introduce little delay. In addition, each flip-flop changes state after only one clock-to-out delay, so counter 300 changes state after only slightly more than one clock-to-out delay. Moreover, whereas combinatorial logic 125 (FIG. 1) adversely impacts latency (i.e., the time required to completely change from one value to the next), the delays imposed by OR gates 325 and 330 do not.

Figure 4:
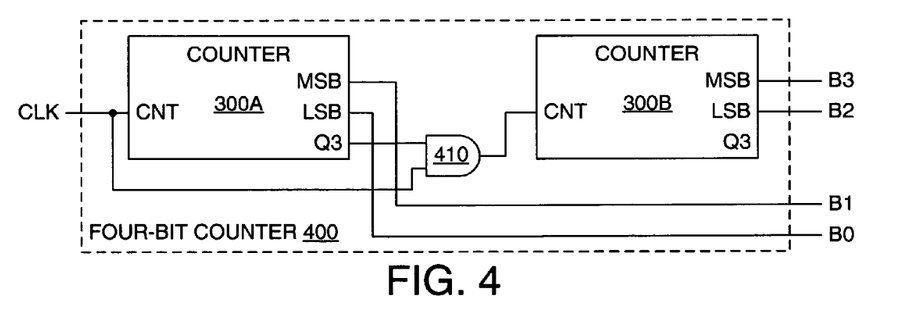
FIG. 4 depicts a 4-bit counter 400 that includes two two-bit counters 300A and 300B like counter 300 of FIG. 3.

FIG. 4 depicts a 4-bit counter 400 that includes two two-bit counters 300A and 300B like counter 300 of FIG. 3. An AND Gate 410 disposed between counters 300A and 300B gates a clock signal CLK provided to both count terminals CNT so counter 300B only counts when the highest order bit of counter 300A (see flip-flop 320 of FIG. 3) stores a logic one. Counter 300B therefore increments every fourth cycle, so the bits of counter 300B are the higher order bits for counter 400.

While counters 300A and 300B are both two-bit counters in this example, other combinations are possible. In general, counter 300A can be an N-bit counter and counter 300B can be an M-bit counter, where M is less than, greater than, or equal to N.

Expanding counter 300 from two bits (FIG. 3) to four bits (FIG. 4) doubled the amount of flip-flops, and required only a small amount of combinatorial logic (i.e., AND gate 410). Thus, in contrast to conventional synchronous counters of the type described in FIG. 1, increasing the number of bits in the manner described in connection with FIG. 4 results in fairly linear growth in area, power, and complexity. Also important, the latency of counter 400 is nearly as short as in counter 300: the only additional delay is imposed by the relatively simple AND gate 410.

Counter 300 could be expanded to provide four bits (or more) without gate 410 and the consequent small increase in update delay. For example, eight flip-flops can be configured in a ring of the type shown in FIG. 3 to produce eight unique states (e.g., 10000000, 01000000, etc.). Combinatorial logic can then be used to represent the eight states as three-bit binary counts (e.g., 000, 001, etc.).

Figure 5:
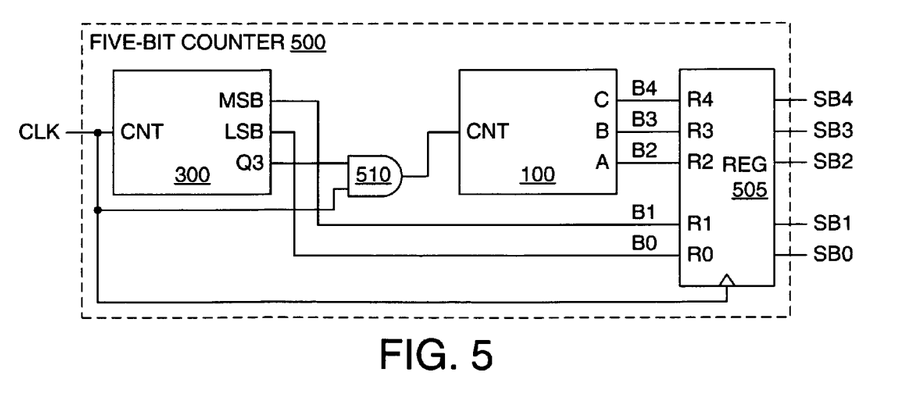
FIG. 5 depicts a five-bit counter 500 in accordance with another embodiment of the invention.

FIG. 5 depicts a five-bit counter 500 in accordance with another embodiment of the invention. In this case, the two-bit synchronous counter 300 of FIG. 3 is used in connection with the conventional synchronous counter 100 of FIG. 1 to produce a five-bit counter. An optional register 505 is added to counter 500 to synchronize the outputs of respective counters 300 and 100.

Assume, for example, that synchronous counter 100 of FIG. 1 is suitably fast for a given application but does not provide the requisite number of bits. Further assume that synchronous counter 100 is expanded to include 5-bits in the conventional manner, then the resulting additional combinatory logic would be too complex to operate at the desired speed or within the constraints of the desired power efficiency. In such a case, synchronous counter 300 can be included to perform the relatively fast switching of the two least-significant bits of the five-bit counter, and would thus eliminate the need to incorporate the relatively complex logic required to extend counter 100 to include two additional high-order bits. In this example, the combinatorial logic required to extend counter 100 to five bits is significant, but not nearly as significant as the amount required to extend a six-bit counter to eight bits. Designers can balance speed, bit-length, area, and power requirements to determine the optimal combination of counter types for a given application.

Figure 6:
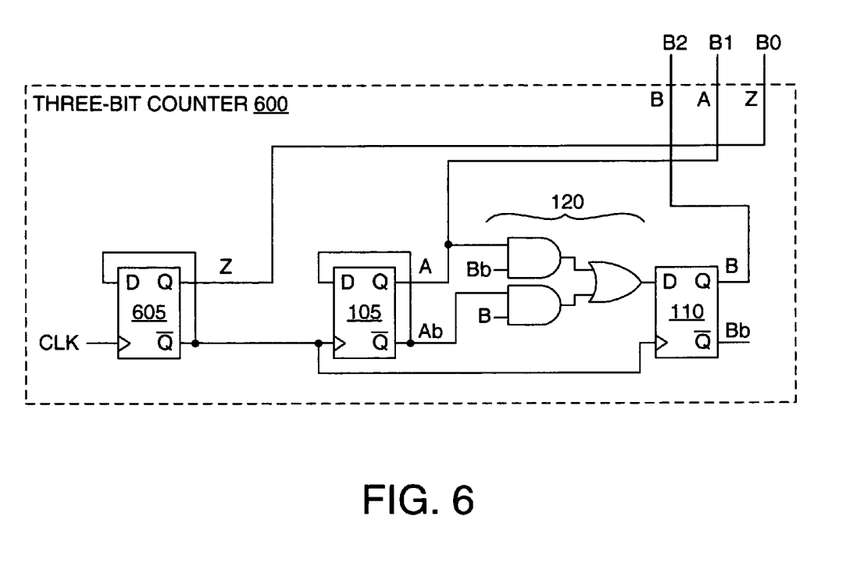
FIG. 6 depicts a three-bit counter 600 in accordance with an embodiment that combines a one-bit ripple counter with a two-bit synchronous counter.

FIG. 6 depicts a three-bit counter 600 in accordance with an embodiment that combines a one-bit ripple counter with a two-bit synchronous counter. A flip-flop 605 stores the lowest-order bit Z in counter 600. The complementary output of flip-flop 605 connects to the clock inputs of the two high-order flip-flops 105 and 110, which together form a two-bit synchronous counter (flip-flops 105 and 110 are configured in the same manner as the like-numbered elements in counter 100 of FIG. 1).

Comparing counter 600 with counter 100 of FIG. 1, both three-bit counters, the inclusion of flip-flop 605 eliminates the need for flip-flop 115 and combinatorial logic 125. Unfortunately, this reduced complexity comes with a cost: flip-flop 605 slows counter 600 by one clock-to-out delay. However, this tradeoff will favor inclusion of flip-flop 605 as the number of bits increases. Imagine a 64-bit synchronous counter, for example. In conventional synchronous counter architectures, the combinatorial logic required to derive the input for the last bit considers the values of all 64 stages. Substituting the last stage with flip-flop 605 eliminates the need for this complex circuitry. In fact, it might be desirable in such a case to eliminate the last N number of stages in the conventional counter by using an N-bit ripple counter for the lower-order bits. The optimal number "N" would be selected to establish a desired balance between speed, bit-length, area, and power requirements. For synchronous counters, care must be taken to ensure all bits increment between counts.

Figure 7:
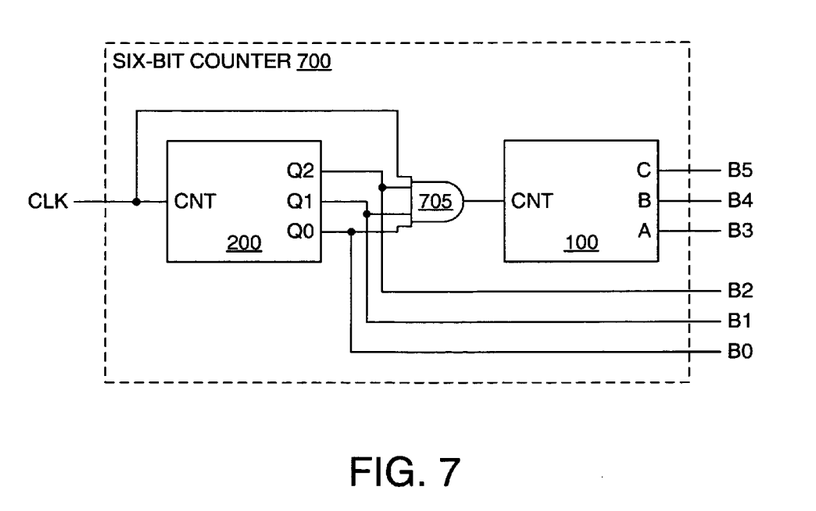
FIG. 7 depicts a six-bit counter 700 in which three-bit ripple counter 200 of FIG. 2 represents the three lower-order bits and three-bit synchronous counter 100 of FIG. 1 represents the three higher-order bits.

FIG. 7 depicts a six-bit counter 700 in which the asynchronous, three-bit ripple counter 200 of FIG. 2 represents the three lower-order bits and three-bit synchronous counter 100 of FIG. 1 represents the three higher-order bits. A four-input AND gate 705 combines the three lower-order bits with the input clock CLK so counter 100 increments when the lower-order bits transition from "111" to "000." As in the previous example, the asynchronous low-order bits update quickly enough to provide correct incremental values between clock cycles.

All counters discussed thus far have been "up" counters. Conventional "down" counters are also available, as are up/down counters, which count in either direction at the direction of one or more control signals.

Figure 8:
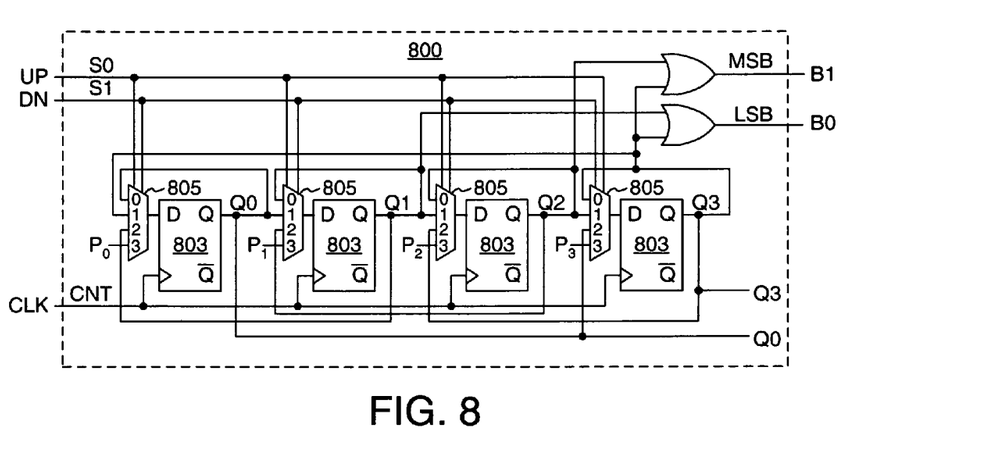
FIG. 8 depicts a synchronous up/down counter 800 in accordance with one embodiment of the invention.

FIG. 8 depicts a synchronous up/down counter 800 in accordance with one embodiment of the invention. Depending upon the states of a pair of control signals UP and DN on a respective pair of select lines S0 and S1, counter 800 increments, decrements, maintains its current state, or loads a value in response to a clock signal on a count line CNT. When control signals UP and DN are both low (i.e., are both voltage levels representative of a logic zero), a collection of multiplexers 805 connects the Q output and D input of each flip-flop 803. Flip-flops 803 therefore retain their states in response to the clock signal CLK. When control signals UP and DN are respectively high and low, multiplexers 805 connect the Q output of each flip-flop 803 to the D input of the subsequent flip-flop 803. Counter 800 thus increments, in the manner described in connection with FIG. 3, as a two-bit UP counter. When control signals UP and DN are respectively low and high, multiplexers 805 connect the Q output of each flip-flop 803 to the D input of the preceding flip-flop 803. In this case, counter 800 cycles in reverse as compared with counter 300 of FIG. 3, and consequently acts as a two-bit down counter. Finally, when control signals UP and DN are both high, multiplexers 805 connect the D input to each flip-flop to one of four parallel-load input terminals P0, P1, P2, and P3. Counter 800 can thus be loaded with any value expressed on terminals P0 through P3.

A synchronous output terminal Q of each flip-flop 803 is considered to be connected directly to its own synchronous input terminal D or the synchronous input terminal of another flip-flop, depending upon the logic levels of signals UP and DN. The words "connected directly" are meant to contrast conventional counters, such as counter 100, that employ combinatorial logic to derive input data for storage elements representing high-order bits.

Figure 9:
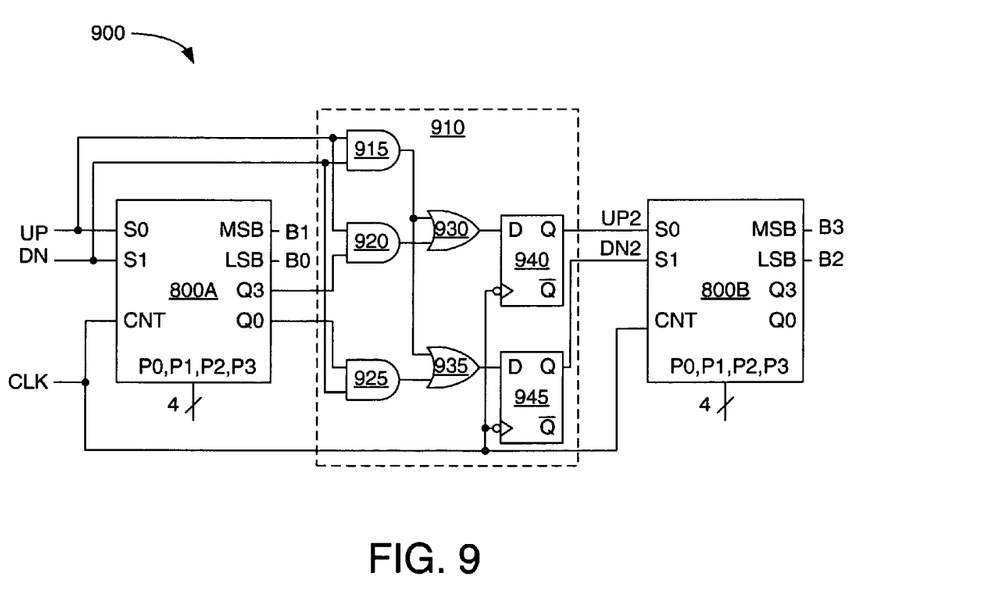
FIG. 9 depicts a four-bit up/down counter 900 that includes a pair of up/down counters 800A and 800B, each of which is identical to counter 800 of FIG. 8.

FIG. 900 depicts a four-bit up/down counter 900 that includes a pair of up/down counters 800A and 800B, each of which is identical to counter 800 of FIG. 8. Counter 800A produces the two least-significant bits B1 and B0 in the manner described in connection with FIG. 8. Counter 800B functions in the same manner, but employs a logic circuit 910 to generate its control signals UP2 and DN2 and its clock signal CLK2.

Logic circuit 910 includes three AND gates 915, 920, and 925, two OR gates 930 and 935, and a pair of flip-flops 940 and 945. Counter 800B increments when UP=1, DN=0, and Q3=1; decrements when UP=0, DN=1, and Q0=1; holds when UP=0 and DN=0; and loads data in parallel when UP=1 and DN=1. Gates 915, 920, 925, 930, and 935 logically combine signals UP, DN, Q3, and Q0 to produce the appropriate control signals UP2 and DN2 for counter 800B. Optional flip-flops 940 and 945 latch the respective output signals from OR gates 930 and 935 on a falling edge of the clock signal. Flip-flops 940 and 945 thus ensure signals UP2 and DN2 remain at logic one, when appropriate, for a short time after counter 800A increments from 0001 to 1000 or decrements from 1000 to 0001.

Figure 10:
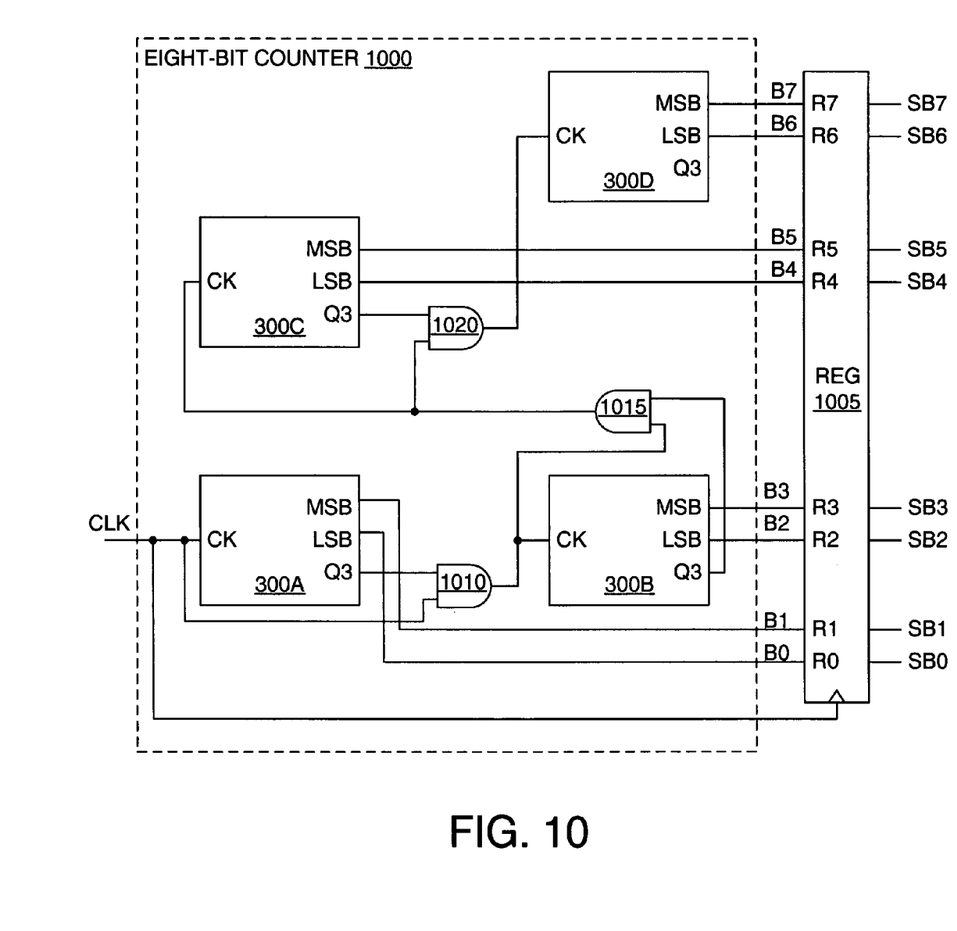
FIG. 10 illustrates how four two-bit counters 300 (FIG. 3) can be combined to make an eight-bit synchronous counter 1000.

FIG. 10 illustrates how four two-bit counters 300A, 300B, 300C and 300D, each identical to counter 300 of FIG. 3, can be combined to make an eight-bit synchronous counter 1000. Counter 1000 is shown connected to an optional eight-bit register 1005. Three simple AND gates 1010, 1015, and 1020 link adjacent counters 300 and gate the clock signal CLK as appropriate. AND gate 1010 clocks counter 300B upon receipt of a rising edge of clock CLK when counter 300A expresses a logic three (i.e., the two low-order bits of counter 1000 are a binary 11); AND gate 1015 clocks counter 300C upon receipt of a rising clock edge when counters 300A and 300B each express a logic three (i.e., the four low order bits of counter 1000 are a binary 1111); and AND gate 1020 clocks counter 300D upon receipt of a rising clock edge when counters 300A, 300B, and 300C each express a logic three (i.e., the six low-order bits of counter 1000 are a binary 111111). The three AND gates 1010 are far less complex then the combinatorial logic required to extend the synchronous counter architecture of FIG. 1 to eight bits.

In the depicted embodiment, each rising clock edge propagates through each AND gate to clock counter 300D. Other embodiments of counter 1000 reduce the delay imposed by the combinatorial logic linking counters 300A–D by employing more complex gates. For example, counter 300C can be clocked by a three-input AND gate combining clock signal CLK with the Q3 outputs of counters 300A and 300B, and counter 300D can be clocked by a four-input AND gate combining clock signal CLK with the Q3 outputs of counters 300A, 300B, and 300C. Many other schemes may also be used.

Figure 11:
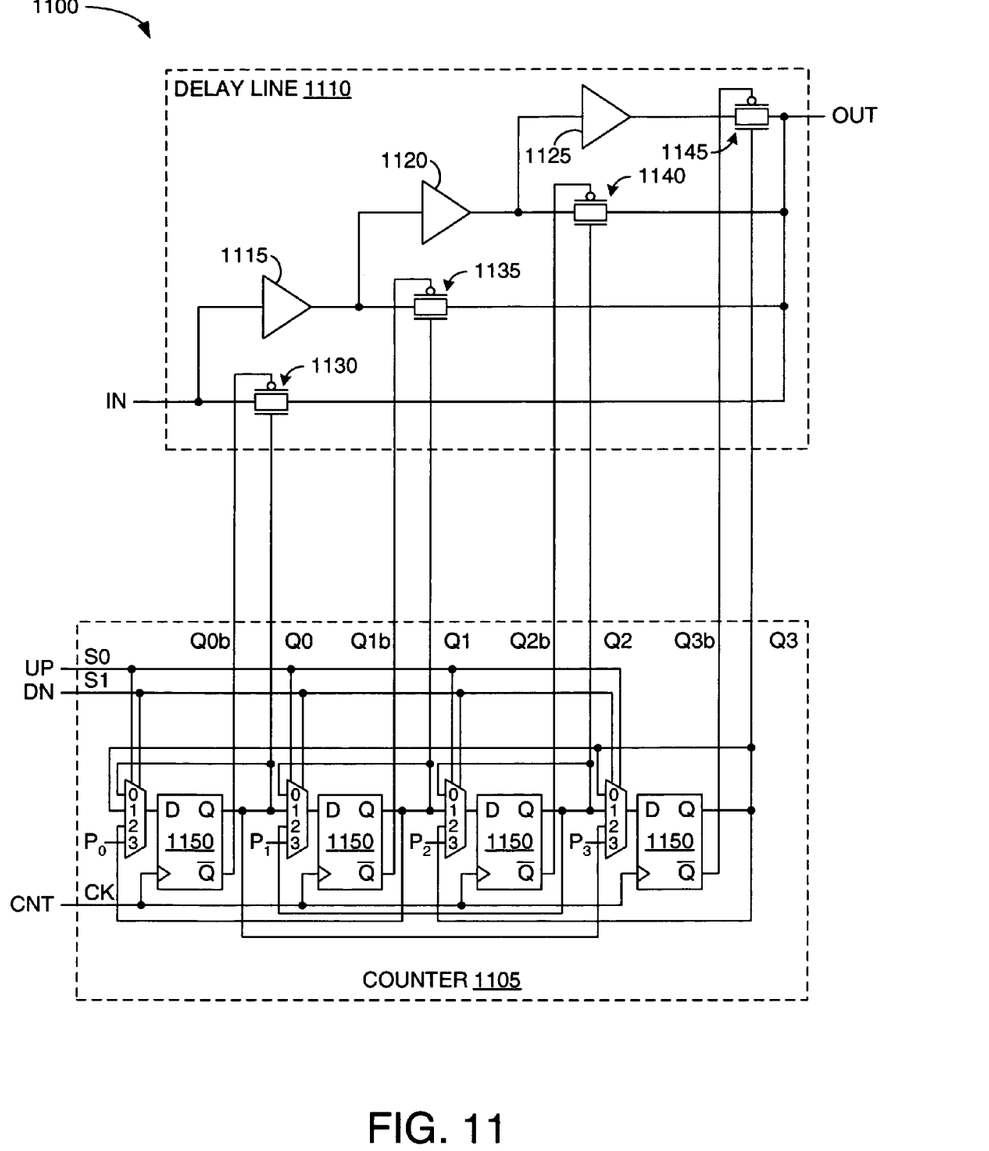
FIG. 11 depicts an adjustable delay circuit 1100, including a counter 1105 and a delay line 1110.

FIG. 11 depicts an adjustable delay circuit 1100, including a counter 1105 and a delay line 1110. Counter 1105 is a modified version of up/down counter 800 (FIG. 8). Delay line 1110 includes an input terminal IN and an output terminal OUT. Delay line 1110 also includes three buffers 1115, 1120, and 1125 and four switches (transmission gates) 1130, 1135, 1140, and 1145. Only one switch is closed at a time, so the signal path between input terminal IN and output terminal OUT either traverses 0, 1, 2, or 3 buffers, depending upon the state of counter 1105. Because each buffer imposes some fixed amount of delay, delay line 1110 selectively imposes 0, 1, 2, or 3 delay increments. Delay lines similar to delay line 1110 are commonly used in delay-locked loops, for example.

Counter 1105 supports the four states described above in connection with FIG. 3 (1000, 0100, 0010, and 0001). In each state, one of four flip-flops 1150 stores a logic one, and consequently enables (closes) an associated one of the switches in delay line 1110. For example, only switch 1130 is closed when counter 1105 is in state 1000. The state of counter 1105 thus determines the delay through delay line 1110. Counter 1105 is synchronous, logically simple, and both counts and changes state very quickly. Also advantageous, counter 1105 can be easily extended to provide for many more states because the latency of counter 1105, and therefore the switching speed of delay circuit 1100, is independent of the number of delay settings. Also advantageous, delay circuit 1100 scales linearly, in terms of power consumption and area, with changes in delay granularity.

While the present invention has been described in connection with specific embodiments, variations of these embodiments will be obvious to those of ordinary skill in the art. It will be obvious, for example, to use the above-described counters in any of myriad applications for digital counters. Moreover, ring counters in some of the foregoing examples can be replaced with Johnson counters and appropriate decoding logic (Johnson counters are well known in the art, and are shown, for example, in Rafiquzzaman "Fundamentals of Digital Logic and Microcomputer Design," pp 212–213 (1999), which is incorporated herein by reference). Therefore, the spirit and scope of the appended claims should not be limited to the foregoing description.

What is claimed is:

1. A variable delay circuit comprising:
   a counter having:
      a count terminal;
      M sequential storage elements, including a least-significant storage element adapted to store a first logic level to express the lowest of M binary counts and a most-significant storage element adapted to store a second logic level to express the highest of the M binary counts, each storage element including a storage-element output terminal;
      M multiplexers coupled to said M sequential storage elements, wherein each multiplexer has a plurality of inputs coupled to receive outputs of at least two sequential storage elements and couples, in response to a first control signal and a second control signal, one of the plurality of inputs to the input of an associated sequential storage element; and
   a delay line having:
      a plurality of delay-line taps disposed between a delay-line input terminal and a delay-line output terminal;
      a plurality of switches, each switch including a switch input terminal connected to a respective one of the delay-line taps, a switch output terminal connected to the delay-line output terminal, and a switch control terminal connected to a respective one of the storage-element output terminals.

2. The variable delay circuit of claim 1, wherein the least-significant storage element includes a synchronous input terminal and the storage-element output terminal of the most-significant storage element connects to the synchronous input terminal.

3. The variable delay circuit of claim 1, wherein the switches comprise transistors.

4. The variable delay circuit of claim 1, wherein each of the storage elements includes a second storage-element output terminal and each of the switches including a second switch control terminal connected to a respective one of the second storage-element output terminals.

5. The variable delay circuit of claim 1, wherein the first control signal and the second control signal comprise an up control signal and a down control signal used to select one of the inputs to the M multiplexers.

6. The variable delay circuit of claim 1, wherein one of the inputs to the multiplexer comprises a value independent of the outputs of the M sequential storage elements.

7. A variable delay circuit comprising:
   a counter having M sequential storage elements, each storage element having a storage element input terminal receiving an input from a multiplexer of M multiplexers based upon the state of independently controlled count up and count down signals coupled to control the M multiplexers and having a storage element output terminal, wherein each multiplexer has a plurality of inputs coupled to receive outputs of at least two sequential storage elements and selects, in response to the independently controlled count up and count down signals, one of the plurality of inputs;
   a delay line having a plurality of delay-line taps disposed between a delay-line input terminal and a delay-line output terminal;
   a plurality of switches, each switch including a switch input terminal receiving an output of a respective one of the delay-line taps, a switch output terminal providing the output to the delay-line output terminal, and a switch control terminal receiving the output of a respective one of the storage element output terminals.

8. The variable delay circuit of claim 7, wherein one of the inputs to the multiplexer comprises a value which is independent of the outputs of the M sequential storage elements.

9. The variable delay circuit of claim 7, wherein the M sequential storage elements comprise D flip-flops.

10. The variable delay circuit of claim 7, wherein the plurality of switches comprise transistor switches.

11. A method of providing a delayed output signal, the method comprising the steps of:
   providing a plurality of storage elements coupled in series;
   controlling an input to the plurality of storage elements using a plurality of multiplexers, wherein each multiplexer has a plurality of inputs coupled to receive outputs of at least two storage elements of the plurality of storage elements and selects, in response to up control and down control signals, one of the inputs;
   coupling, for each storage element of the plurality of storage elements, an output to a switch of a delay line of a plurality of delay lines; and
   independently selecting the up control and down control signals of an up/down counter to control the output of the plurality of delay lines.

12. The method of claim 11, wherein the step of independently selecting the up control and down control signals of an up/down counter comprises a step of selecting the output of a storage element as an input to another storage element.

13. The method of claim 12, wherein the step of independently selecting the up control and down control signals of an up/down counter comprises a step of selecting an input to a multiplexer which is independent of the outputs of the M sequential storage elements.

14. The method of claim 13, wherein the step of selecting an input to a multiplexer which is independent of the outputs of the M sequential storage elements comprises a step of initializing the state of the M sequential storage elements.

15. The method of claim 11, wherein the step of independently selecting the up control and down control signals of an up/down counter comprises a step of enabling the selection of one of four inputs to be coupled to the M sequential storage elements.

* * * * *